United States Patent
Yang (10) Patent No.: US 11,508,446 B2
(45) Date of Patent: Nov. 22, 2022

(54) METHOD FOR ACCESSING FLASH MEMORY MODULE AND ASSOCIATED FLASH MEMORY CONTROLLER AND ELECTRONIC DEVICE

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/030,330

(22) Filed: Sep. 23, 2020

(65) Prior Publication Data

US 2022/0093191 A1   Mar. 24, 2022

(51) Int. Cl.
*G11C 16/34* (2006.01)
*G11C 16/08* (2006.01)
*G11C 16/30* (2006.01)
*G11C 16/26* (2006.01)
*G11C 16/20* (2006.01)

(52) U.S. Cl.
CPC .......... *G11C 16/3431* (2013.01); *G11C 16/08* (2013.01); *G11C 16/20* (2013.01); *G11C 16/26* (2013.01); *G11C 16/30* (2013.01)

(58) Field of Classification Search
CPC ..... G11C 16/3431; G11C 16/08; G11C 16/20; G11C 16/26; G11C 16/30
See application file for complete search history.

(56) References Cited

U.S. PATENT DOCUMENTS

| | | | | |
|---|---|---|---|---|
| 9,595,320 | B2* | 3/2017 | Wu | G11C 11/5642 |
| 9,645,177 | B2* | 5/2017 | Cohen | G11C 16/3418 |
| 10,381,090 | B2* | 8/2019 | Oh | G11C 16/0466 |
| 2018/0294036 | A1 | 10/2018 | Oh | |

* cited by examiner

*Primary Examiner* — Vanthu T Nguyen
(74) *Attorney, Agent, or Firm* — Winston Hsu (57) ABSTRACT

The present invention provides a method for access a flash memory module, wherein the method includes the steps of: sending a read command to the flash memory module to read a plurality of memory cells of at least one word line of the flash memory module by using a plurality of read voltages, wherein each memory cell is configured to store a plurality of bits, each memory cell has a plurality of states, the states are used to indicate different combinations of the plurality of bits; obtaining readout information from the flash memory module; analyzing the readout information to determine numbers of the states of the memory cells; determining if the memory cells are balance or unbalance according the numbers of the states of the memory cells to generate a determination result; and referring to the determination result to adjust voltage levels of the plurality of read voltages.

10 Claims, 8 Drawing Sheets

METHOD FOR ACCESSING FLASH MEMORY MODULE AND ASSOCIATED FLASH MEMORY CONTROLLER AND ELECTRONIC DEVICE

BACKGROUND OF THE INVENTION

1. Field of the Invention

The present invention relates to a flash memory controller.

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the Universal Flash Storage (UFS) and embedded Multi Media Card (eMMC) specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories have been applied to the memory devices, there are some problems such as an increased bit error rate, etc. Although a traditional sensing scheme regarding reading data from the TLC flash memories has been proposed to try solving the problems, it does not work for the memory devices equipped with the quadruple level cell (QLC) flash memories. More particularly, the traditional sensing scheme is not good for high-level per memory cell in the QLC flash memories. Thus, a novel method and associated architecture are needed for enhancing overall performance without introducing any side effect or in a way that is less likely to introduce a side effect.

In addition, with the development of 3D flash memory, the data stored in the flash memory will encounter serious data retention problem, that is, the data quality is degraded after a few days after the data is written to the flash memory. When the data retention issue occurs, a flash memory controller needs to use a complicated decoding method such as soft decoding method or RAID (Redundant Array of Independent Disks) data recovery to obtain the data, thus increasing the reading time. To overcome the data retention issue, the conventional art performs a background scanning to detect quality of blocks within the flash memory module, and moves valid data of the blocks with poor data quality to other blank blocks. However, this conventional art needs much time to scan all of the blocks, and the system performance is degraded. In addition, if the system is always busy, the flash memory controller may not have enough time to perform the background scanning.

SUMMARY OF THE INVENTION

It is therefore an objective of the present invention to provide a flash memory controller, which uses an active foreground scanning to determine appropriate read voltages, for reading the data stored in the flash memory controller, to solve the above-mentioned problems.

According to one embodiment of the present invention, a method for access a flash memory module includes the steps of: sending a read command to the flash memory module to read a plurality of memory cells of at least one word line of the flash memory module by using a plurality of read voltages, wherein each memory cell is configured to store a plurality of bits, each memory cell has a plurality of states, the states are used to indicate different combinations of the plurality of bits; obtaining readout information from the flash memory module; analyzing the readout information to determine numbers of the states of the memory cells; determining if the memory cells are balance or unbalance according the numbers of the states of the memory cells to generate a determination result; and referring to the determination result to adjust voltage levels of the plurality of read voltages.

According to another embodiment of the present invention, a flash memory controller comprising memory and a microprocessor is disclosed, wherein the flash memory controller is coupled to a flash memory module, the flash memory module comprises at least one flash memory chip, each flash memory chip comprises a plurality of blocks, each block comprises a plurality of pages. The microprocessor is configured to: send a read command to the flash memory module to read a plurality of memory cells of at least one word line of the flash memory module by using a plurality of read voltages, wherein each memory cell is configured to store a plurality of bits, each memory cell has a plurality of states, the states are used to indicate different combinations of the plurality of bits; obtain readout information from the flash memory module; analyze the readout information to determine numbers of the states of the plurality of memory cells; determine if the plurality of memory cells are balance or unbalance according the numbers of the states of the plurality of memory cells to generate a determination result; and refer to the determination result to adjust voltage levels of the plurality of read voltages.

According to another embodiment of the present invention, a memory device comprising a flash memory module and a flash memory controller is disclosed The flash memory controller is configured to: send a read command to the flash memory module to read a plurality of memory cells of at least one word line of the flash memory module by using a plurality of read voltages, wherein each memory cell is configured to store a plurality of bits, each memory cell has a plurality of states, the states are used to indicate different combinations of the plurality of bits; obtain readout information from the flash memory module; analyze the readout information to determine numbers of the states of the plurality of memory cells; determine if the plurality of memory cells are balance or unbalance according the numbers of the states of the plurality of memory cells to generate a determination result; and refer to the determination result to adjust voltage levels of the plurality of read voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
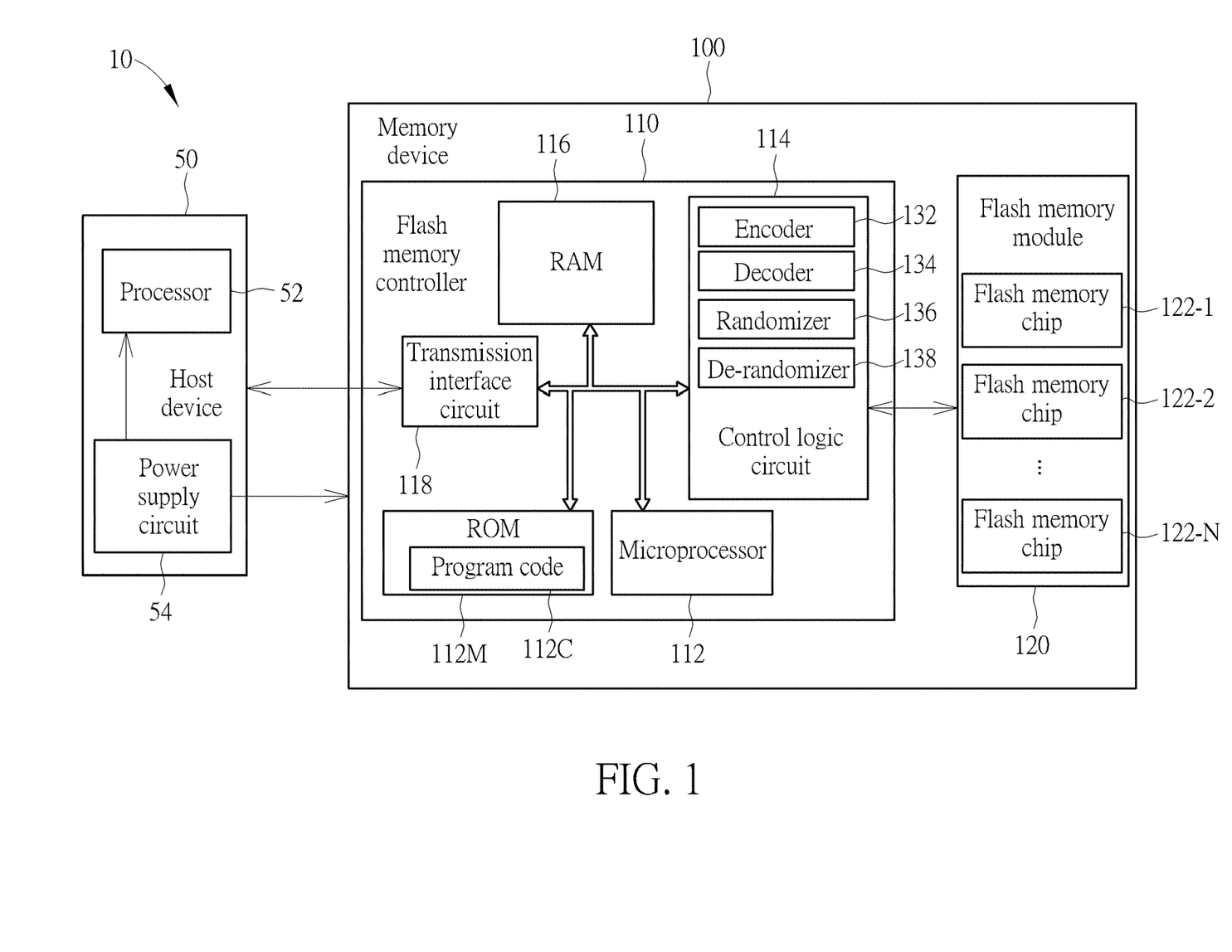
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, ..., and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The flash memory controller 110 receives the host commands and the logical addresses, and translates the host commands into memory operating commands (which may be simply referred to as operating commands), and further controls the flash memory module 120 with the operating commands to perform reading, writing/programing, etc. on memory units (e.g. data pages) having physical addresses within the flash memory module 120, where the physical addresses correspond to the logical addresses. When the flash memory controller 110 perform an erase operation on any flash memory chip 122-n of the plurality of flash memory chips 122-1, 122-2, ..., and 122-N (in which "n" may represent any integer in the interval [1, N]), at least one block of multiple blocks of the flash memory chip 122-n may be erased, where each block of the blocks may comprise multiple pages (e.g. data pages), and an access operation (e.g. reading or writing) may be performed on one or more pages.

Figure 2:
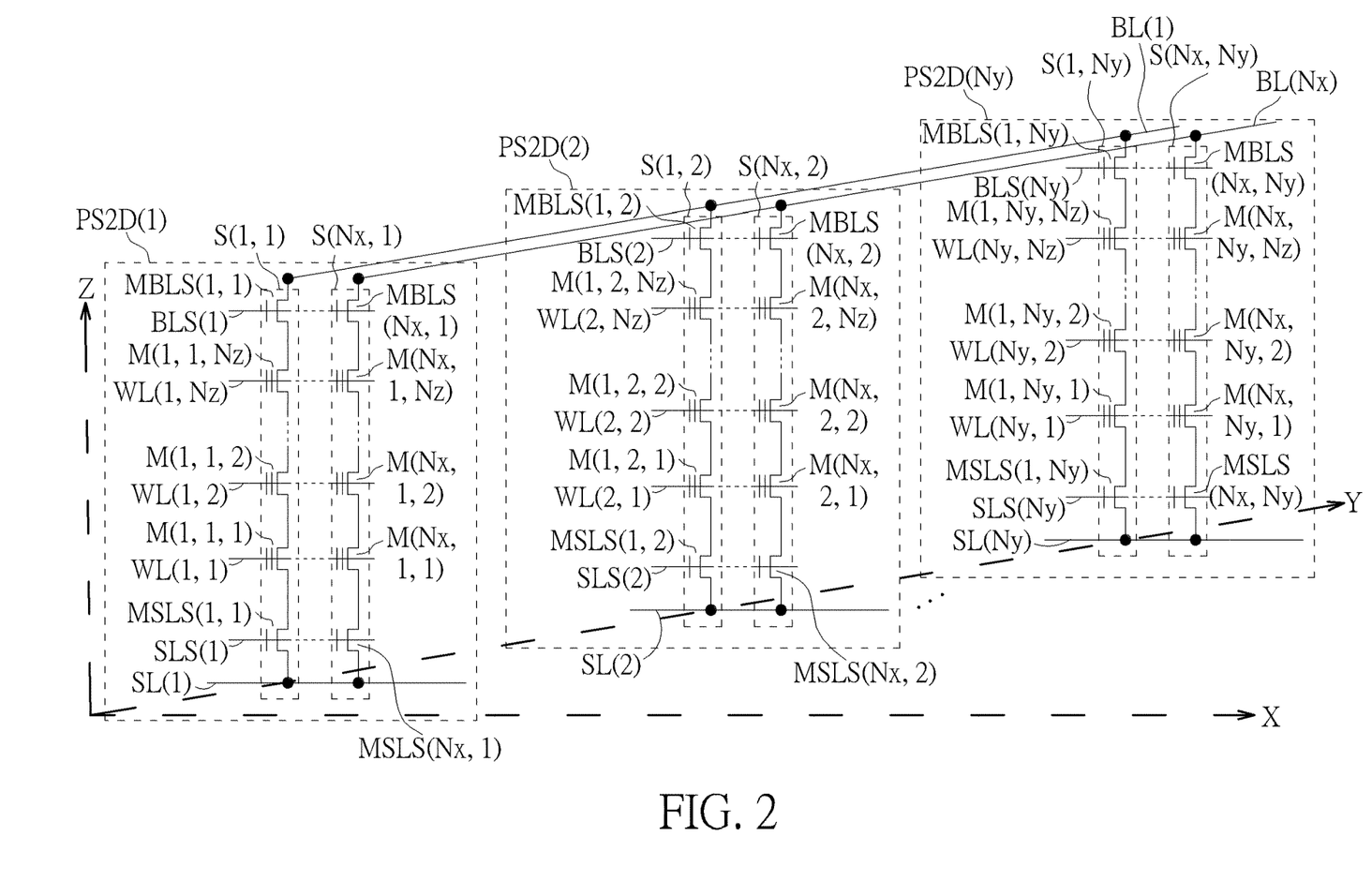
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one of the flash memory chips 122-1, 122-2, ..., and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny* Nz) memory cells {{M(1, 1, 1), ..., M(Nx, 1, 1)}, {M(1, 2, 1), ..., M(Nx, 2, 1)}, ..., {M(1, Ny, 1), ..., M(Nx, Ny, 1)}}, {{M(1, 1, 2), ..., M(Nx, 1, 2)}, {M(1, 2, 2), ..., M(Nx, 2, 2)}, ..., {M(1, Ny, 2), ..., M(Nx, Ny, 2)}}, ..., and {{M(1, 1, Nz), ..., M(Nx, 1, Nz)}, {M(1, 2, Nz), ..., M(Nx, 2, Nz)}, ..., {M(1, Ny, Nz), ..., M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), ..., MBLS(Nx, 1)}, {MBLS(1, 2), ..., MBLS(Nx, 2)}, ..., and {MBLS(1, Ny), ..., MBLS(Nx, Ny)} that are arranged in an upper layer above the Nz layers and (Nx*Ny) lower selector circuits {MSLS(1, 1), ..., MSLS(Nx, 1)}, {MSLS(1, 2), ..., MSLS(Nx, 2)}, ..., and {MSLS(1, Ny), ..., MSLS(Nx, Ny)} that are arranged in a lower layer below the Nz layers. In addition, the 3D NAND flash memory may comprise a plurality of bit lines and a plurality of word lines for access control, such as Nx bit lines BL(1), ..., and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), ..., and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

In the flash memory module 120, when the block of any one of the flash memory chips 122-1-122-N serves as a SLC block, each of the physical pages within the block correspond to one logical page, that is each of the memory cells of the page is configured to store only one bit, wherein one physical page may comprise all of the transistors controlled by a word line (e.g. the memory cells M(1, 1, Nz)-M(Nx, 1, Nz) corresponding to the word line WL(1, Nz) form a physical page). When the block of any one of the flash memory chips 122-1-122-N serves as an MLC block, each of the physical pages within the block correspond to two logical pages, that is each of the memory cells of the page is configured to store two bits. When the block of any one of the flash memory chips 122-1-122-N serves as a TLC block, each of the physical pages within the block correspond to three logical pages, that is each of the memory cells of the page is configured to store three bits. When the block of any one of the flash memory chips 122-1-122-N serves as a QLC block, each of the physical pages within the block correspond to four logical pages, that is each of the memory cells of the page is configured to store four bits.

Figure 3:
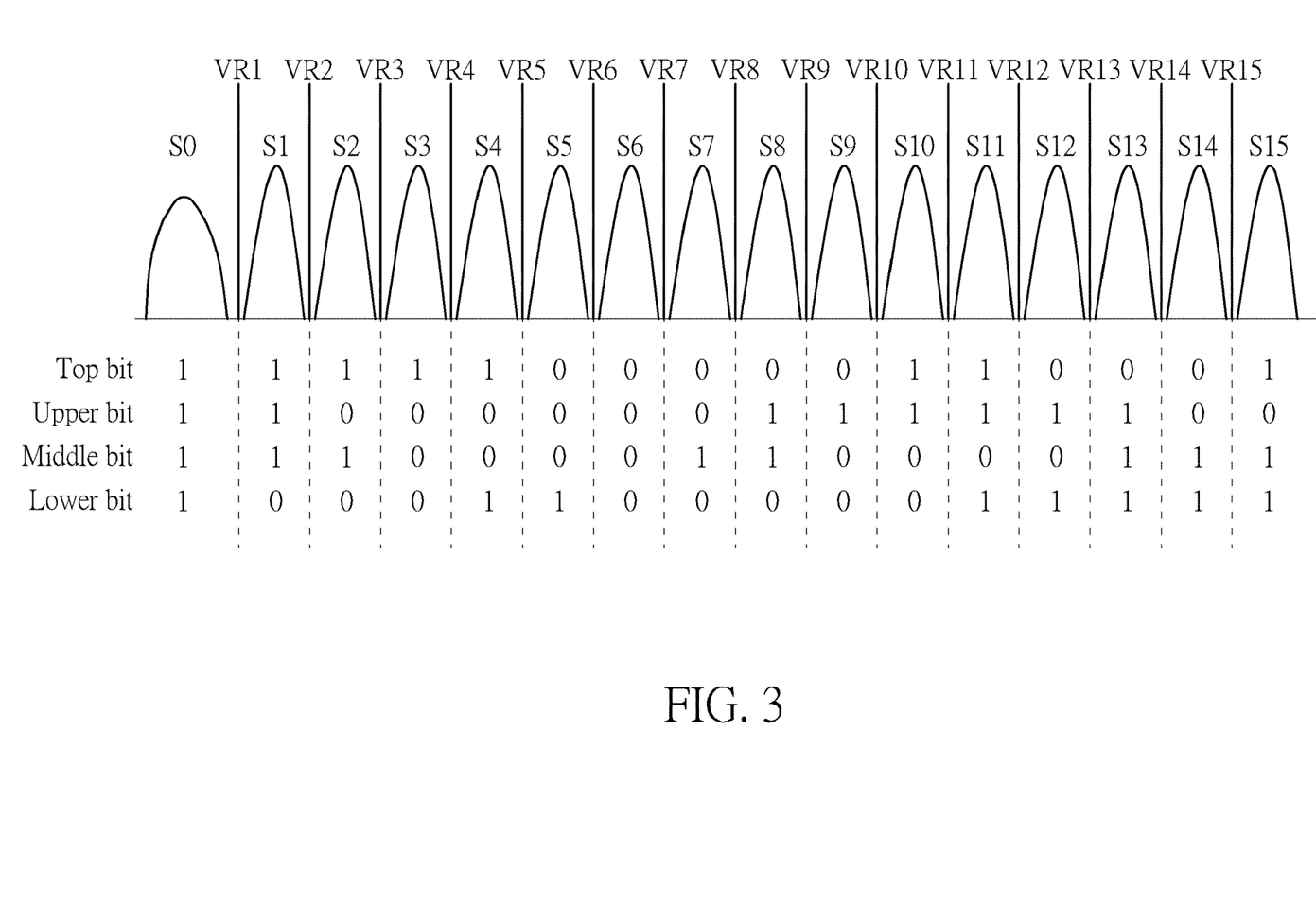
FIG. 3 is a diagram illustrating a plurality of states (program states) of a memory cell of the QLC block according to one embodiment of the present invention.

FIG. 3 is a diagram illustrating a plurality of states (program states) of a memory cell of the QLC block according to one embodiment of the present invention. As shown in FIG. 3, each memory cell can have sixteen states, and each state represents different combinations of four bits that are named as a top bit, an upper bit, a middle bit and a lower bit. In the embodiment shown in FIG. 3, when the memory cell is programmed to have the state S0, the top bit, the upper bit, the middle bit and the lower bit stored in the memory cell are (1, 1, 1, 1); when the memory cell is programmed to have the state S1, the top bit, the upper bit, the middle bit and the lower bit stored in the memory cell are (1, 1, 1, 0); when the memory cell is programmed to have the state S2, the top bit, the upper bit, the middle bit and the lower bit stored in the memory cell are (1, 0, 1, 0); when the memory cell is programmed to have the state S3, the top bit, the upper bit, the middle bit and the lower bit stored in the memory cell are (1, 0, 0, 0); when the memory cell is programmed to have the state S4, the top bit, the upper bit, the middle bit and the lower bit stored in the memory cell are (1, 0, 0, 1); when the memory cell is programmed to have the state S5, the top bit, the upper bit, the middle bit and the lower bit stored in the memory cell are (0, 0, 0, 1); when the memory cell is programmed to have the state S6, the top bit, the upper bit, the middle bit and the lower bit stored in the memory cell are (0, 0, 0, 0); when the memory cell is programmed to have the state S7, the top bit, the upper bit, the middle bit and the lower bit stored in the memory cell are (0, 0, 1, 0); when the memory cell is programmed to have the state S8, the top bit, the upper bit, the middle bit and the lower bit stored in the memory cell are (0, 1, 1, 0); when the memory cell is programmed to have the state S9, the top bit, the upper bit, the middle bit and the lower bit stored in the memory cell are (0, 1, 0, 0); when the memory cell is programmed to have the state S10, the top bit, the upper bit, the middle bit and the lower bit stored in the memory cell are (1, 1, 0, 0); when the memory cell is programmed to have the state S11, the top bit, the upper bit, the middle bit and the lower bit stored in the memory cell are (1, 1, 0, 1); when the memory cell is programmed to have the state S12, the top bit, the upper bit, the middle bit and the lower bit stored in the memory cell are (0, 1, 0, 1); when the memory cell is programmed to have the state S13, the top bit, the upper bit, the middle bit and the lower bit stored in the memory cell are (0, 1, 1, 1); when the memory cell is programmed to have the state S14, the top bit, the upper bit, the middle bit and the lower bit stored in the memory cell are (0, 0, 1, 1); and when the memory cell is programmed to have the state S15, the top bit, the upper bit, the middle bit and the lower bit stored in the memory cell are (1, 0, 1, 1).

In the conventional art, when the top bit is required to be read by the flash memory controller 110, the flash memory controller 110 can control the flash memory module 120 to apply four read voltages VR5, VR10, VR12 and VR15 to read the memory cell. If the memory cell is conductive when the read voltage VR5 is applied, the top bit is determined to be "1"; if the memory cell is not conductive when the read voltage VR5 is applied, and the memory cell is conductive when the read voltage VR10 is applied, the top bit is determined to be "0"; if the memory cell is not conductive when the read voltage VR10 is applied, and the memory cell is conductive when the read voltage VR12 is applied, the top bit is determined to be "1"; if the memory cell is not conductive when the read voltage VR12 is applied, and the memory cell is conductive when the read voltage VR15 is applied, the top bit is determined to be "0"; and if the memory cell is not conductive when the read voltage VR15 is applied, the top bit is determined to be "1". When the upper bit is required to be read by the flash memory controller 110, the flash memory controller 110 can control the flash memory module 120 to apply three read voltages VR2, VR8 and VR14 to read the memory cell. If the memory cell is conductive when the read voltage VR2 is applied, the upper bit is determined to be "1"; if the memory cell is not conductive when the read voltage VR2 is applied, and the memory cell is conductive when the read voltage VR8 is applied, the upper bit is determined to be "0"; if the memory cell is not conductive when the read voltage VR8 is applied, and the memory cell is conductive when the read voltage VR14 is applied, the upper bit is determined to be "1"; and if the memory cell is not conductive when the read voltage VR14 is applied, the upper bit is determined to be "0". When the middle bit is required to be read by the flash memory controller 110, the flash memory controller 110 can control the flash memory module 120 to apply four read voltages VR3, VR7, VR9 and VR13 to read the memory cell. If the memory cell is conductive when the read voltage VR3 is applied, the middle bit is determined to be "1"; if the memory cell is not conductive when the read voltage VR3 is applied, and the memory cell is conductive when the read voltage VR7 is applied, the middle bit is determined to be "0"; if the memory cell is not conductive when the read voltage VR7 is applied, and the memory cell is conductive when the read voltage VR9 is applied, the middle bit is determined to be "1"; if the memory cell is not conductive when the read voltage VR9 is applied, and the memory cell is conductive when the read voltage VR13 is applied, the middle bit is determined to be "0"; and if the memory cell is not conductive when the read voltage VR13 is applied, the middle bit is determined to be "1". When the lower bit is required to be read by the flash memory controller 110, the flash memory controller 110 can control the flash memory module 120 to apply four read voltages VR1, VR4, VR6 and VR11 to read the memory cell. If the memory cell is conductive when the read voltage VR1 is applied, the lower bit is determined to be "1"; if the memory cell is not conductive when the read voltage VR1 is applied, and the memory cell is conductive when the read voltage VR4 is applied, the lower bit is determined to be "0"; if the memory cell is not conductive when the read voltage VR4 is applied, and the memory cell is conductive when the read voltage VR6 is applied, the lower bit is determined to be "1"; if the memory cell is not conductive when the read voltage VR6 is applied, and the memory cell is conductive when the read voltage VR11 is applied, the lower bit is determined to be "0"; and if the memory cell is not conductive when the read voltage VR11 is applied, the lower bit is determined to be "1".

It is noted that the gray code shown in FIG. 3 is for illustratively only, and it's not a limitation of the present invention. Any suitable gray code can be used in the memory device 100, and the read voltages for determining the top bit, the upper bit, the middle bit and the lower bit may be changed accordingly.

The bit read from the memory cell by using part of the read voltages VR1-VR15 can be regarded as a sign bit, and the sign bits obtained from a plurality of memory cells (e.g. 4K memory cells) are processed by the de-randomizer 138 and performed error correction operations by the decoder 134 to generate the encoded data. However, because the state intervals of the memory cell within the QLC block are small, the states may have serious variations due to the read disturbance, program disturbance or data retention issue occurred in the flash memory, and the error correction operations may be failed. To solve this problem, the conventional art further applies additional read voltages to read the memory cell to obtain a plurality of soft bits to increase the success rate of the error correction operations. For example, if the decoder 134 fails to decode the sign bits obtained from the memory cells, the flash memory controller 110 may control the flash memory module 120 to use additional read voltages to read the memory cells again to obtain a first group of soft bits, and the decoder 134 uses a low-density parity-check code (LDPC) method to decode the sign bits with the first group of soft bits. For example, if the flash memory controller 110 intends to read the top page (i.e. the top bits of the memory cells) of the block, the flash memory controller 110 may control the flash memory module 120 to use the additional read voltages (VR5−Δ), (VR10−Δ), (VR12−Δ) and (VR15−Δ) to obtain the first group of soft bits. If the decoder 134 still fails, the flash memory controller 110 may control the flash memory module 120 to use additional read voltages (VR5+Δ), (VR10+Δ), (VR12+Δ) and (VR15+Δ) to read the memory cells again to obtain a second group of soft bits, and the decoder 134 uses the LDPC method to decode the sign bits with the first group of soft bits and the first group of soft bits, . . . , and so on.

In light of above, if the flash memory controller 110 needs to read data from the QLC block within the flash memory module 120, the flash memory controller 110 may read the memory cells and decode the data many times to obtain the soft bits to successfully decode the data, each time the flash memory controller 110 reading the memory cells needs to transmit a read command to the flash memory module 120, and the flash memory module 120 needs a read busy time to read the sign bits or soft bits. Therefore, the conventional read mechanism for the high density storage such as QLC blocks with the 3D NAND flash memory is inefficient.

To solve the above-mentioned problem, the embodiments of the present invention provide a method for actively detecting information of the states, to determine if the states have variations due to the read disturbance, program disturbance or data retention issue occurred in the flash memory. Then, the flash memory controller 110 controls part the read voltages VR1-VR15 to have appropriate levels so that the flash memory controller 110 can increase the decoding success rate to improve the system efficiency.

Figure 4:
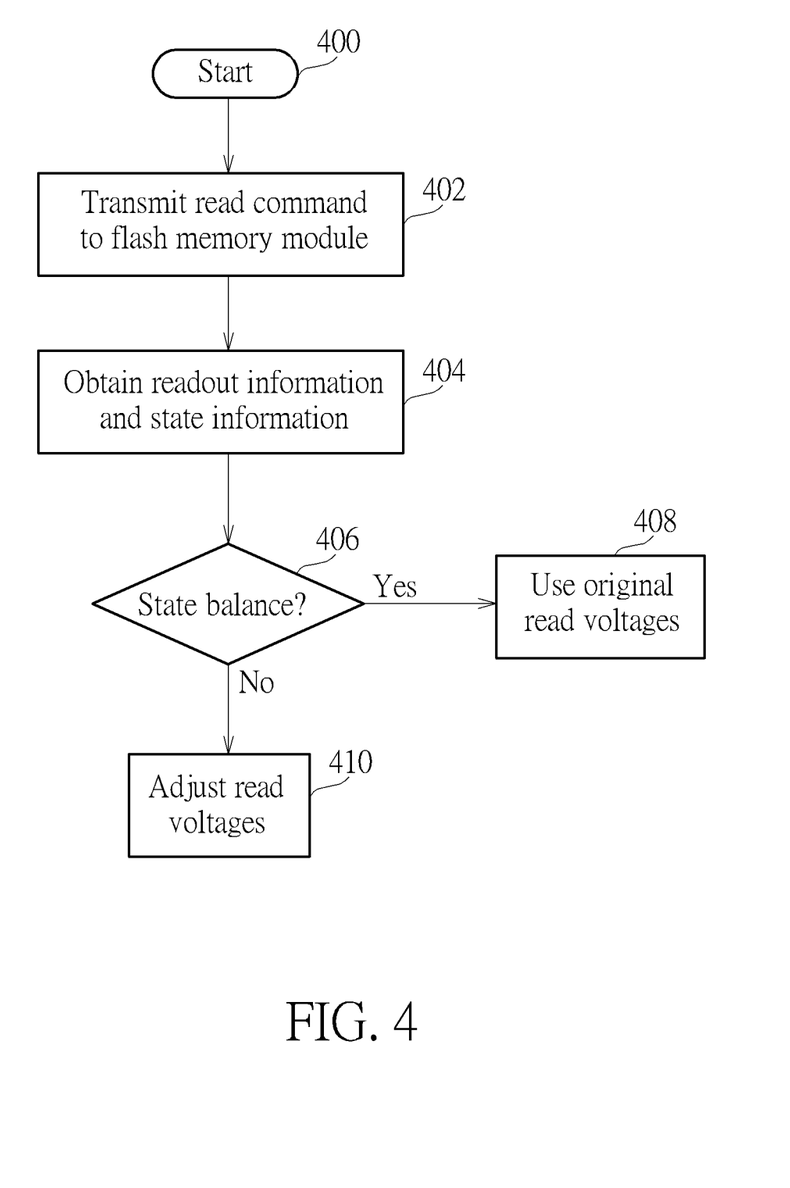
FIG. 4 is a flowchart of a method for accessing the flash memory module according to one embodiment of the preset invention.

FIG. 4 is a flowchart of a method for accessing the flash memory module 120 according to one embodiment of the present invention. In Step 400, the flow starts, and the host device 50 and the memory device 100 are powered on. In Step 402, the flash memory controller 110 sends a read command to the flash memory module 120 and asks for data of one or more pages. In Step 404, the flash memory module 120 receives the read command, and uses all the read voltages to read all the memory cells of the page to generate readout information, and the flash memory module 120 transmits the readout information to the flash memory controller 110. Taking FIG. 3 as an example, the flash memory module 120 uses the read voltages VR1-VR15 to read every memory cell of a word line to obtain data of four pages. Because all read voltage VR1-VR15 are used to read the memory cells, the flash memory controller 110 can exactly know quantity of each state shown in FIG. 3. In Step 406, in the process of receiving data sequentially from the flash memory module 120, the flash memory controller 110 determines if numbers of the states of at least part of the memory cells are balance or unbalance to generate a determination result, and if the determination result indicates that the numbers of the states of part of the memory cells are balance, the flows enters Step 408; and if the determination result indicates that the numbers of the states of part of the memory cells are unbalance, the flows enters Step 410.

Figure 5:
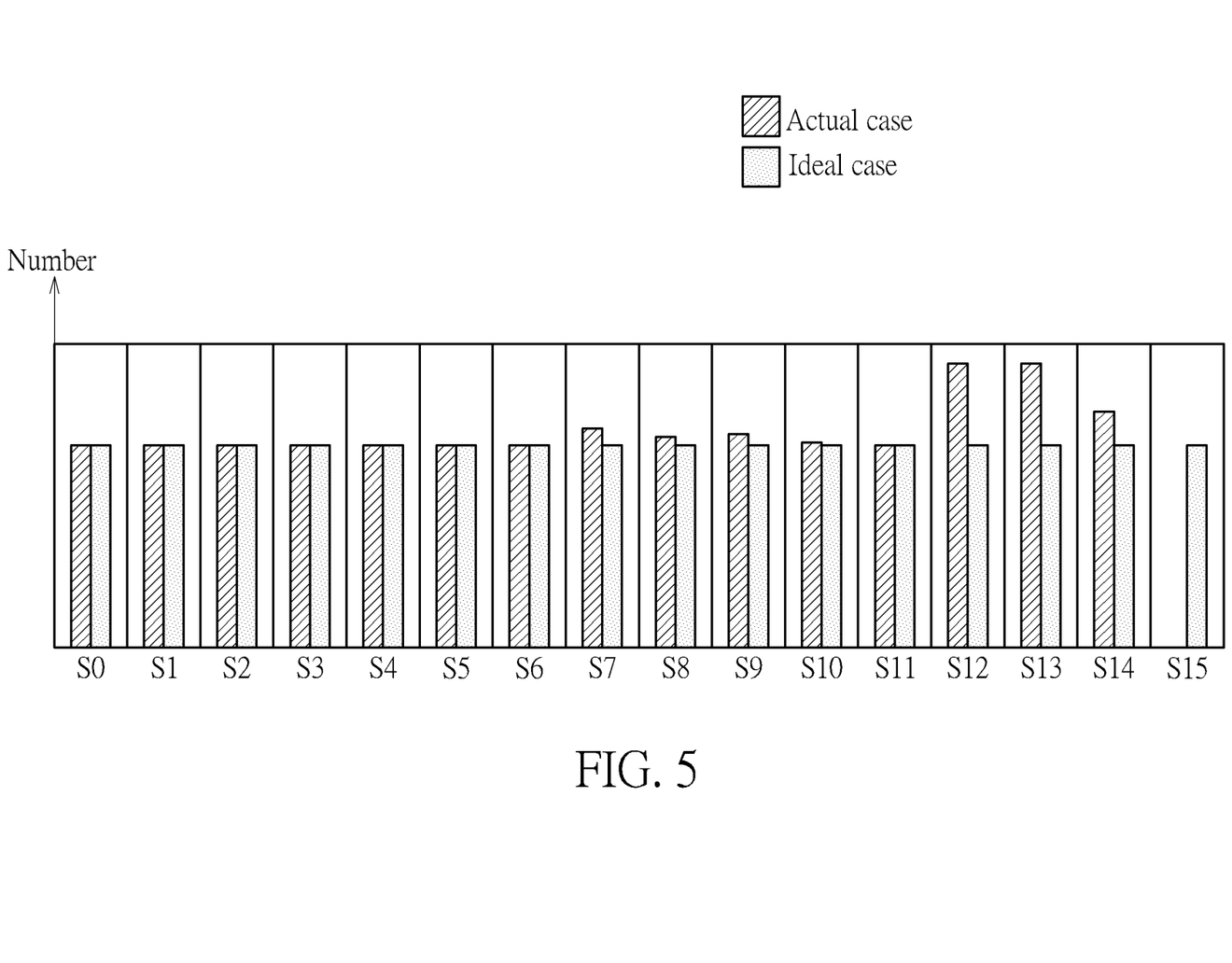
FIG. 5 is a histogram of the states of the memory cells according to one embodiment of the present invention.

Specifically, because the data written into the flash memory module 120 is processed by the randomizer 136 before, the numbers of the states S0-S15 should be close to each other. For example, if the flash memory controller 110 receives the MSBs of sixteen thousand memory cells from the flash memory module 120, the number of each of the states S0-S15 of the sixteen thousand memory cells should be about "1000". If the difference(s) between the numbers of the states is/are within a defined range, the numbers of the states are determined to be balance; and if the difference(s) between the numbers of the states is/are not within the defined range, the numbers of the states are determined to be unbalance. For example, the flash memory controller 110 may build a histogram shown in FIG. 5. As shown in FIG. 5, ideally the states S0-S15 have the similar numbers, and if the page suffers the data retention or read disturbance issue, the memory cells may have the threshold value shifting issue. In the example shown in FIG. 5, the state S15 is shifted to other states such as S12-S14, so the sense amplifier does not sense the state S15 from any memory cell, and the phenomenon of this threshold value shifting issue cause the unbalance state numbers.

If the flash memory controller 110 determines that the numbers of the states of at least part of the memory cells are balance, the flow enters the Step 408 and the flash memory controller 110 can control the flash memory module 120 to use the original read voltages to read the following pages. If the flash memory controller 110 determines that the numbers of the states of at least part of the memory cells are unbalance, the flow enters the Step 410 and the flash memory controller 110 to adjust part of the read voltages VR1-VR15 so that the flash memory controller 110 can control the flash memory module 120 to use the adjusted read voltages with appropriate voltage levels to read the following pages.

Regarding Step 406, the microprocessor 112 or the control logic 114 may calculate a difference between the number of each state of the memory cells and the ideal value to generate determination result, for determining if the states of at least part of the memory cells are balance or unbalance. Specifically, referring to FIG. 5, assuming that the ideal number of each state of the memory cells is "1000", and the actual numbers of the states S0-S15 are "1002", "990", "980", "1028", "1010", "990", "1010", "1100", "1050", "1050", "1020", "1000", "1300", "1300", "1180" and "0", respectively, the microprocessor 112 or the control logic 114 may calculate the differences corresponding to the states S0-S15 as follows: "2", "−10", "−20", "28", "10", "−10", "10", "100", "50", "50", "20", "0", "300", "300", "180" and "−1000". In one embodiment, if any one of the differences is greater than a threshold value such as "80", the microprocessor 112 or the control logic 114 determines that the states of the memory cells are unbalance; and if each of the differences is not greater than the threshold value, the microprocessor 112 or the control logic 114 determines that the states of the memory cells are balance.

Figure 6:
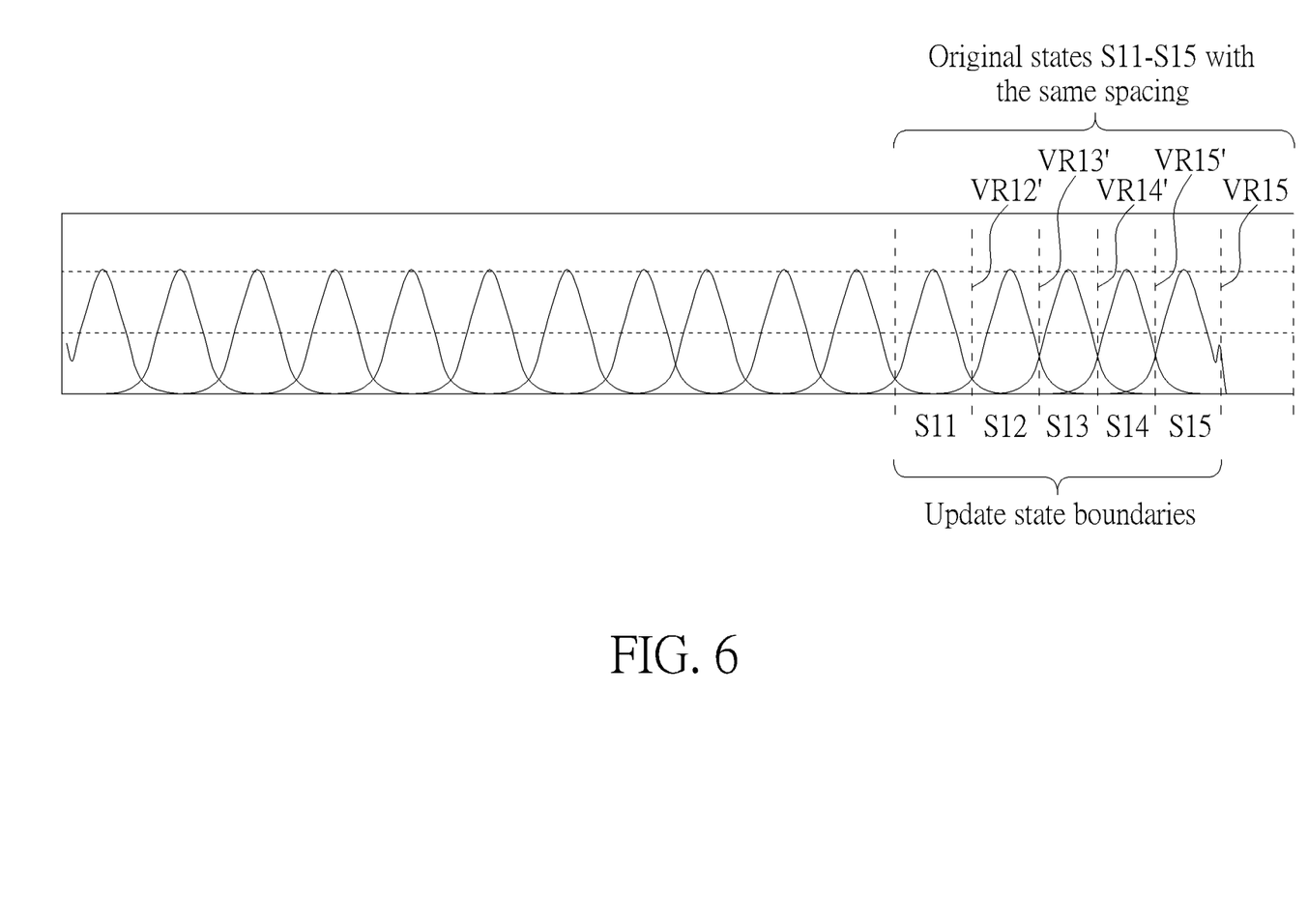
FIG. 6 is a diagram showing the threshold voltage distribution of the memory cells according to one embodiment of the present invention.

Regarding the Step 410, the microprocessor 112 or the control logic 114 can refer to the differences calculated in the Step 406 to determine the updated read voltages. For example, the microprocessor 112 or the control logic 114 can determine an updated read voltage VR15' according to the differences corresponding to the states S14 and S15, the microprocessor 112 or the control logic 114 can determine an updated read voltage VR14' according to the updated read voltage VR15' and the differences corresponding to the states 513 and 514, the microprocessor 112 or the control logic 114 can determine an updated read voltage VR13' according to the updated read voltage VR14' and the differences corresponding to the states S12 and S13, the microprocessor 112 or the control logic 114 can determine an updated read voltage VR12' according to the updated read voltage VR13' and the differences corresponding to the states 511 and 512, and so on. The relationship between the above parameters such as the updated read voltages and the differences may be built in a look-up table, and the microprocessor 112 or the control logic 114 can refer to the differences calculated in the Step 406 to determine the updated read voltages by using the look-up table. FIG. 6 shows the updated read voltages VR12', VR13', VR14' and VR15' that are used to replace the original read voltages VR12, VR13, VR14 and VR15. Referring to FIG. 6, because the states S15, S14, S13 and S12 are shifted to the left, the microprocessor 112 or the control logic 114 adjusts the read voltages VR12, VR13, VR14 and VR15 to the left to generate the updated read voltages VR12', VR13', VR14' and VR15' having lower voltage levels than before.

The flow shown in FIG. 4 can be executed in a foreground operation and/or a background operation. Taking the background operation as an example, when the flash memory controller 110 is determined to be idle, the microprocessor 112 can start the flow shown in FIG. 4 to send the read command to the flash memory module 120. For example, the microprocessor 112 can determine that the flash memory controller 110 is idle when the flash memory controller 110 does not receive any read command or write command from the host device 50 within several seconds. Taking the foreground operation as an example, when the flash memory controller 110 receives the read command from the host 50, the flash memory controller 110 sends the read command to the flash memory module 120 to obtain the readout information required by the host 50, and the flash memory controller 110 further uses the readout information read from the flash memory module 120 to execute the Steps 406/408/410. In addition, if the host 50 sends the read command to ask for only one logical page (e.g. only upper bits of the memory cells of a word line), the flash memory controller 110 may use the all of the read voltages VR1-VR15 to read the top bits, the upper bits, the middle bits and the lower bits of the memory cells of the word line, for the use to determine if the states of the memory cells are balance or unbalance (Step 406); and the decoder 134 and the de-randomizer 138 may only process the readout information corresponding the upper bits to generate data to the host 50.

In one embodiment, because the flow shown in FIG. 4 may occupy system resources, the flow shown in FIG. 4 can be disabled when the updated read voltages are appropriate. For example, if the host device 50 sends the read command asking for fifty logical pages within a block, the flash memory controller 110 may use part of the readout information (e.g. twelve logical pages) to determine if the states of the memory cells are balance or unbalance.

In the above embodiment shown in FIGS. 4-6, the microprocessor 112 or the control logic 114 may calculate the difference between the number of each state of the memory cells and the ideal value to generate the determination result, wherein the ideal value is an average value of each state. For example, if sixteen thousand memory cells are read, and there are sixteen states S0-S15, the ideal value (average value) is "1000". However, using the average value to serve as the ideal value may have errors in the determination of the adjusted read voltages. To solve the above problems, the number of each state of the memory cells when the data is written into the flash memory module 120 is recorded (hereinafter, the original number of each state of the memory cells), and the original numbers are used as ideal values for calculating the difference between the number of each state of the memory cells and the ideal values.

Figure 7:
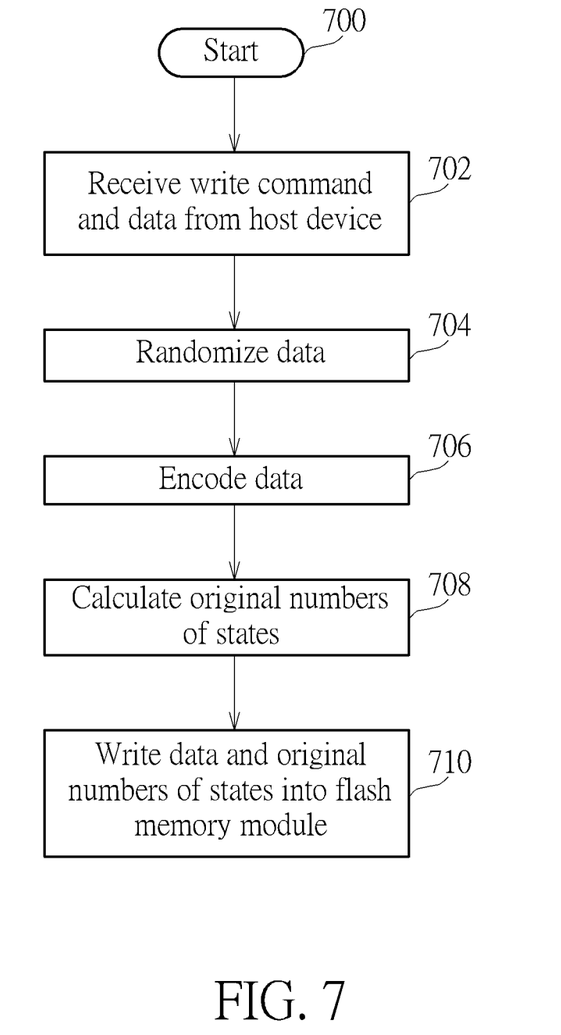
FIG. 7 is a flowchart of a method for writing data into the flash memory module according to one embodiment of the present invention.

Specifically, FIG. 7 shows a flow or recording the original numbers of states S0-S15 according to one embodiment of the present invention. In Step 700, the flow starts. In Step 702, the flash memory controller 110 receives a write command and data from the host device 50, wherein the data corresponds to four logical pages (i.e. the data can be stored in the memory cells of a single word line). In Step 704, the randomizer 136 performs a data shaping operation on the data to generate randomized data. In Step 706, the encoder 132 encodes the randomized data to generate encoded data, wherein the encoded data comprises the randomized data and corresponding error correcting code (ECC). In Step 708, the control logic circuit 114 calculates the numbers (original numbers) of the states S0-S15. Specifically, the control logic circuit 114 can refer to the gray code shown in FIG. 3 to calculate the numbers of the states S0-S15. For example, assuming that the encoded data correspond to four logical pages respectively named top page, upper page, middle page and lower page, when bits of the top page, upper page, middle page and lower page prepared to be written into a memory cell are "1", "1", "1", "1", respectively, it is determined that the memory cell corresponds to the state S0; when bits of the top page, upper page, middle page and lower page prepared to be written into a memory cell are "1", "1", "1", "0", respectively, it is determined that the memory cell corresponds to the state S0; when bits of the top page, upper page, middle page and lower page prepared to be written into a memory cell are "1", "0", "1", "0", respectively, it is determined that the memory cell corresponds to the state S2; when bits of the top page, upper page, middle page and lower page prepared to be written into a memory cell are "1", "0", "0", "0", respectively, it is determined that the memory cell corresponds to the state S3; and so on. In Step 710, the flash memory controller 110 writes the encoded data with the original numbers of the memory cells into the pages of the word line. Specifically, the information of the original numbers of the memory cells can be encoded by the encoder 132 for data protection and then being recorded in a spare region or a meta chunk of one or more pages of the word line.

Figure 8:
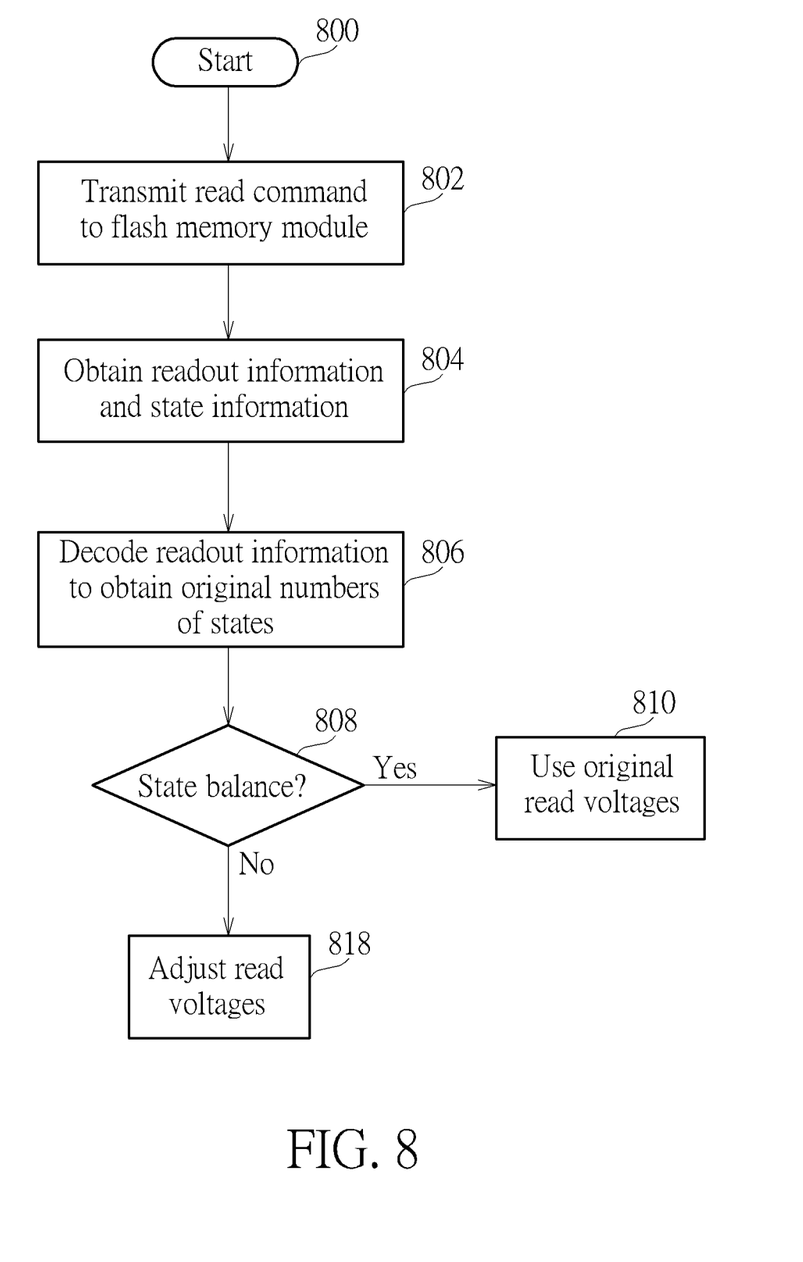
FIG. 8 is a flowchart of a method for accessing the flash memory module according to another embodiment of the preset invention.

FIG. 8 is a flowchart of a method for accessing the flash memory module 120 according to another embodiment of the present invention. In Step 800, the flow starts, and the host device 50 and the memory device 100 are powered on. In Step 802, the flash memory controller 110 sends a read command to the flash memory module 120 and asks for data of one or more pages. In Step 804, the flash memory module 120 receives the read command, and uses all the read voltages to read all the memory cells of the page to generate readout information, and the flash memory module 120 transmits the readout information to the flash memory controller 110. Taking FIG. 3 as an example, the flash memory module 120 uses the read voltages VR1-VR15 to read every memory cell of a word line to obtain readout information of four pages. Because all read voltage VR1-VR15 are used to read the memory cells, the flash memory controller 110 can exactly know quantity of each state shown in FIG. 3. In Step 806, the decoder 134 decodes the readout information to obtain the original numbers of the states S0-S15 of the memory cells of the word line. In Step 808, in the process of receiving data sequentially from the flash memory module 120, the flash memory controller 110 determines if numbers of the states of at least part of the memory cells are balance or unbalance to generate a determination result, and if the determination result indicates that the numbers of the states of part of the memory cells are balance, the flows enters Step 810; and if the determination result indicates that the numbers of the states of part of the memory cells are unbalance, the flows enters Step 812.

Regarding Step 808, the microprocessor 112 or the control logic 114 may calculate a difference between the number of each state of the memory cells and the ideal value (i.e. original number of each state) to generate determination result, for determining if the states of at least part of the memory cells are balance or unbalance. Specifically, similar to the embodiment shown in FIG. 5, assuming that the original numbers of the states S0-S15 are "950", "990", "1020", "1030", "1020", "1030", "960", "1000", "1010", "990", "950", "1050", "1100", "1100", "1050" and "650", respectively; and the actual numbers of the states S0-S15 are "1002", "990", "980", "1028", "1010", "990", "1010", "1100", "1050", "1050", "1020", "1000", "1300", "1300", "1180" and "0", respectively, the microprocessor 112 or the control logic 114 may calculate the differences corresponding to the states S0-S15 as follows: "52", "0", "−40", "−2", "−10", "−40, "50", "100", "40", "60", "70", "−50", "200", "200", "130" and "−650". In one embodiment, if any one of the differences is greater than a threshold value, the microprocessor 112 or the control logic 114 determines that the states of the memory cells are unbalance; and if each of the differences is not greater than the threshold value, the microprocessor 112 or the control logic 114 determines that the states of the memory cells are balance.

Briefly summarize, in the embodiments of the present invention, because the read voltages are adjusted based on the state information of the memory cells, most of the readout information may be successfully decoded by using hard decoding method only, and only small amount of readout information needs soft decoding method such as LDPC. Therefore, the operation of the decoder becomes faster, and the efficiency of the flash memory controller is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, comprising:
sending a read command to the flash memory module to read a plurality of memory cells of at least one word line of the flash memory module by using a plurality of read voltages, wherein each memory cell is configured to store a plurality of bits, each memory cell supports a plurality of states, each memory cell has only one of the plurality of states, the states are used to indicate different combinations of the plurality of bits;
obtaining readout information from the flash memory module;
analyzing the readout information to determine numbers of the states of the plurality of memory cells;
determining if the plurality of memory cells are balance or unbalance by calculating differences between the numbers of the states of the plurality of memory cells and ideal values, to generate a determination result; and
referring to the determination result to adjust voltage levels of the plurality of read voltages;
wherein the ideal values are original numbers of the states of the plurality of memory cells that are generated according to data that is prepared to be stored into the plurality of memory cells, and the data is written into pages of a word line of the flash memory module while the ideal values are written into a spare region or a meta chunk of the pages of the word line of the flash memory module; and after the data and the ideal values is stored in the flash memory module, the data and the ideal values is read from the flash memory module in response to the read command to generate the readout information.

2. The method of claim 1, further comprising:
before the step of sending the read command to the flash memory module:
receiving a write command and data from a host device;
performing a data-shaping operation on the data to generate randomized data;
encoding the randomized data to generate encoded data;
calculating the original numbers of the states based on the encoded data; and
writing the encoded data and the original numbers of the state into the plurality of memory cells.

3. The method of claim 1, wherein the step of determining if the plurality of memory cells are balance or unbalance by calculating the differences between the numbers of the states of the plurality of memory cells and the ideal values comprises:
if any one of the differences corresponding to the states is greater than a threshold value, determining that the plurality of memory cells are unbalance to generate the determination result; and
if none of the differences corresponding to the states is greater than the threshold value, determining that the plurality of memory cells are balance to generate the determination result.

4. The method of claim 1, wherein the step of referring to the determination result to adjust the voltage levels of the plurality of read voltages comprises:
if the determination result indicates that the plurality of memory cells are balance, not adjust the voltage levels of the plurality of read voltages; and
if the determination result indicates that the plurality of memory cells are unbalance, adjusting the voltage levels of the plurality of read voltages according to the differences between the numbers of the states of the plurality of memory cells and the ideal values.

5. The method of claim 1, wherein the method is executed in a foreground operation of a flash memory controller.

6. A flash memory controller, wherein the flash memory controller is coupled to a flash memory module, the flash memory module comprises at least one flash memory chip, each flash memory chip comprises a plurality of blocks, each block comprises a plurality of pages, and the flash memory controller comprising:
a memory, for storing a program code; and
a microprocessor, for executing the program code to access the flash memory module;
wherein the microprocessor is configured to:
send a read command to the flash memory module to read a plurality of memory cells of at least one word line of the flash memory module by using a plurality of read voltages, wherein each memory cell is configured to store a plurality of bits, each memory cell supports a plurality of states, each memory cell has only one of the plurality of states, the states are used to indicate different combinations of the plurality of bits;
obtain readout information from the flash memory module;
analyze the readout information to determine numbers of the states of the plurality of memory cells;
determine if the plurality of memory cells are balance or unbalance by calculating differences between the numbers of the states of the plurality of memory cells and ideal values, to generate a determination result; and
refer to the determination result to adjust voltage levels of the plurality of read voltages;
wherein the ideal values are original numbers of the states of the plurality of memory cells that are generated according to data that is prepared to be stored into the plurality of memory cells, and the data is written into pages of a word line of the flash memory module while the ideal values are written into a spare region or a meta chunk of the pages of the word line of the flash memory module; and after the data and the ideal values is stored in the flash memory module, the data and the ideal values is read from the flash memory module in response to the read command to generate the readout information.

7. The flash memory controller of claim 6, wherein before the microprocessor sends the read command to the flash memory module, the microprocessor is further configured to:
receive a write command and data from a host device;
perform a data-shaping operation on the data to generate randomized data;
encode the randomized data to generate encoded data;
calculate the original numbers of the states based on the encoded data; and write the encoded data and the original numbers of the state into the plurality of memory cells.

8. The flash memory controller of claim 6, wherein if any one of the differences corresponding to the states is greater than a threshold value, the microprocessor determines that the plurality of memory cells are unbalance to generate the determination result; and if none of the differences corresponding to the states is greater than the threshold value, the microprocessor determines that the plurality of memory cells are balance to generate the determination result.

9. The flash memory controller of claim 6, wherein if the determination result indicates that the plurality of memory cells are balance, the microprocessor does not adjust the voltage levels of the plurality of read voltages; and if the determination result indicates that the plurality of memory cells are unbalance, the microprocessor adjusts the voltage levels of the plurality of read voltages according to the differences between the numbers of the states of the plurality of memory cells and the ideal values.

10. A memory device, comprising:
a flash memory module; and
a flash memory controller, configured to access the flash memory controller;
wherein the flash memory controller is configured to:
send a read command to the flash memory module to read a plurality of memory cells of at least one word line of the flash memory module by using a plurality of read voltages, wherein each memory cell is configured to store a plurality of bits, each memory cell supports a plurality of states, each memory cell has only one of the plurality of states, the states are used to indicate different combinations of the plurality of bits;
obtain readout information from the flash memory module;
analyze the readout information to determine numbers of the states of the plurality of memory cells;
determine if the plurality of memory cells are balance or unbalance by calculating differences between the numbers of the states of the plurality of memory cells and ideal values, to generate a determination result; and
refer to the determination result to adjust voltage levels of the plurality of read voltages;
wherein the ideal values are original numbers of the states of the plurality of memory cells that are generated according to data that is prepared to be stored into the plurality of memory cells, and the data is written into pages of a word line of the flash memory module while the ideal values are written into a spare region or a meta chunk of the pages of the word line of the flash memory module; and after the data and the ideal values is stored in the flash memory module, the data and the ideal values is read from the flash memory module in response to the read command to generate the readout information.

* * * * *